United States Patent
Arvin et al.

(10) Patent No.: US 9,466,547 B1
(45) Date of Patent: Oct. 11, 2016

(54) PASSIVATION LAYER TOPOGRAPHY

(71) Applicant: GLOBALFOUNDRIES Inc., Grand Cayman (KY)

(72) Inventors: Charles L. Arvin, Savannah, GA (US); Brian M. Erwin, Lagrangeville, NY (US); Jeffrey P. Gambino, Portland, OR (US); Christopher D. Muzzy, Burlington, VT (US); Wolfgang Sauter, Eagle-Vail, CO (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/734,600

(22) Filed: Jun. 9, 2015

(51) Int. Cl.
| | |
|---|---|
| H01L 23/31 | (2006.01) |
| H01L 23/498 | (2006.01) |
| H01L 21/48 | (2006.01) |
| H01L 21/54 | (2006.01) |

(52) U.S. Cl.
CPC ....... *H01L 23/3171* (2013.01); *H01L 21/4853* (2013.01); *H01L 21/54* (2013.01); *H01L 23/3178* (2013.01); *H01L 23/49811* (2013.01); *H01L 23/49838* (2013.01)

(58) Field of Classification Search
None
See application file for complete search history.

(56) References Cited

U.S. PATENT DOCUMENTS

| | | | |
|---|---|---|---|
| 6,011,301 A | 1/2000 | Chiu | |
| 6,528,417 B1 | 3/2003 | Wang et al. | |
| 7,808,113 B2 | 10/2010 | Gallegos | |
| 7,875,502 B2* | 1/2011 | Brofman | H01L 21/563 257/E23.081 |
| 7,897,433 B2 | 3/2011 | Su et al. | |
| 7,935,408 B2 | 5/2011 | Daubenspeck et al. | |
| 8,058,108 B2 | 11/2011 | Topacio et al. | |
| 8,169,076 B2* | 5/2012 | Lii | H01L 24/05 257/737 |
| 8,772,083 B2* | 7/2014 | Leung | H01L 23/49811 257/E23.001 |
| 2007/0120269 A1 | 5/2007 | Hsieh et al. | |
| 2008/0169555 A1 | 7/2008 | Topacio et al. | |
| 2010/0187689 A1* | 7/2010 | Kulkarni | H01L 21/563 257/738 |
| 2011/0193211 A1* | 8/2011 | Chandrasekaran | H01L 21/563 257/686 |
| 2011/0222256 A1 | 9/2011 | Topacio | |

* cited by examiner

*Primary Examiner* — Yasser A Abdelaziez
(74) *Attorney, Agent, or Firm* — Yuanmin Cai; Andrew M. Calderon; Roberts Mlotkowski Safran Cole & Calderon, P.C.

(57) ABSTRACT

A topographical structure is formed within an integrated circuit (IC) chip passivation layer. The topographical structure includes a trench extending below the top surface of the passivation layer and above the top surface of an uppermost inter-metallic dielectric layer underlying the passivation layer associated with the uppermost wiring line of the IC chip. The topographical structure may also include a ridge above the top surface of the passivation layer along the perimeter of the trench. The topographical structure may be positioned between a series of IC chip contact pads and/or may be positioned around a particular IC chip contact pad. The topographical structures increase the surface area of the passivation layer resulting in increased underfill bonding to the passivation layer. The topographical structures also influence capillary movement of capillary underfill and may be positioned to speed up, slow down, or divert the movement of the capillary underfill.

17 Claims, 7 Drawing Sheets

PASSIVATION LAYER TOPOGRAPHY

FIELD OF THE EMBODIMENTS

Embodiments of the present invention generally relate to electronic devices and more specifically to integrated circuit (IC) chip packages utilizing passivation layer topography to reduce chip package interconnect (CPI) stresses and to improve adhesion between underfill and the passivation layer.

DESCRIPTION OF THE RELATED ART

A flip chip IC chip package, also known as controlled collapse chip connection or its acronym, C4, is a structural technique for interconnecting semiconductor devices, such as IC chips and microelectromechanical systems (MEMS), to external circuitry with solder bumps that have been deposited onto contact pads. The solder bumps are deposited on the contact pads on the top side of the wafer during the final wafer processing step. In order to attach the IC chip to external circuitry (e.g., a circuit board, another IC chip or wafer, a carrier, or the like), it is flipped over so that its top side faces down, and aligned so that its contact pads align with contact pads on the external circuit, and then the solder is reflowed to complete the interconnect. Such interconnection may leave a small space between flip chip IC chip package and the external circuitry. In some instances, an electrically-insulating adhesive is underfilled to provide a stronger mechanical connection, provide a heat bridge, and to ensure the solder joints are not stressed due to differential heating of the IC chip and the rest of the system. The underfill distributes the thermal expansion mismatch between the IC chip and the external circuitry, preventing stress concentration in the solder joints which would lead to premature failure.

CPI stresses can result to delamination fractures that propagate between the underfill and a passivation layer of IC chip. The propagating delamination may break the solder interconnection demining the flip chip IC chip package.

A known technique to prevent delamination fractures between the underfill and the passivation layer is to designate otherwise electrically sufficient solder joints as non-functional. The non-functional solder joint limits delamination from propagating to functional solder joints. This technique limits the number of solder joints and the capacity to wire out the IC chip. Further the delamination may propagate more than expected damaging the functional solder joints.

Another known technique to prevent delamination fractures between the underfill and the passivation layer is to form anchors extending through the passivation layer into underlying layers of the IC chip. However, this technique moves stresses within the underfill directly to the underlying layers creating weaknesses in the underlying layers. Further, the break in the underlying layers can expose internal wiring of the IC chip or limit where internal wiring is located.

SUMMARY

In an embodiment of the present invention, a method to fabricate an electronic package includes depositing a passivation layer upon an upper inter-metallic dielectric layer of an IC chip, forming a topography structure within the passivation layer, wherein the topography structure includes a trench of a depth less than the passivation layer thickness, and bonding the IC chip and the external circuitry with underfill between the external circuitry and the patterned passivation layer.

In another embodiment, an electronic package includes an IC chip and external circuitry bonded to the IC chip with underfill. The IC chip includes a patterned passivation layer upon an upper inter-metallic dielectric layer. The patterned passivation layer includes a topography structure within the passivation layer. The topography structure includes a trench of a depth less than the passivation layer thickness, The underfill is between the external circuitry and the patterned passivation layer.

In another embodiment, a method includes applying a passivation layer upon an uppermost inter-metallic dielectric layer of an IC chip, laser forming a topography structure within the passivation layer, wherein the topography structure includes a trench of a depth less than the passivation layer thickness, forming a contact trench within the passivation layer, the contact trench exposing a wiring line of the IC chip associated with the upper inter-metallic dielectric layer, forming a contact pad within the contact trench, the contact pad electrically connected to the exposed wiring line, depositing a solder bump upon the contact pad, aligning external circuitry with the IC chip, the external circuitry compromising a contact pad aligned with the solder bump, depositing underfill between the external circuitry and the patterned passivation layer, the underfill bonding the IC chip and the external circuitry.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention related to a topographical structure or a series of topographical structures formed within the IC chip passivation layer. The topographical structure is a trench extending below the top surface of the passivation layer and above the top surface of the layer underlying the passivation layer. In other words, the trench lays entirely within the passivation layer. The topographical structure may also include ridges above the top surface of the passivation layer along the perimeter of the trench. The topographical structure may be positioned between a series of IC chip contact pads (e.g., between two adjacent contact pads, between four adjacent contact pads, or the like) and/or may be positioned around the IC chip contact pad. The topographical structures increase the surface area between the IC chip and the underfill, resulting in increased bonding there between. The topographical structures also influence capillary movement of capillary underfill and may be positioned to speed up, slow down, or divert the movement of the capillary underfill.

Figure 1A:
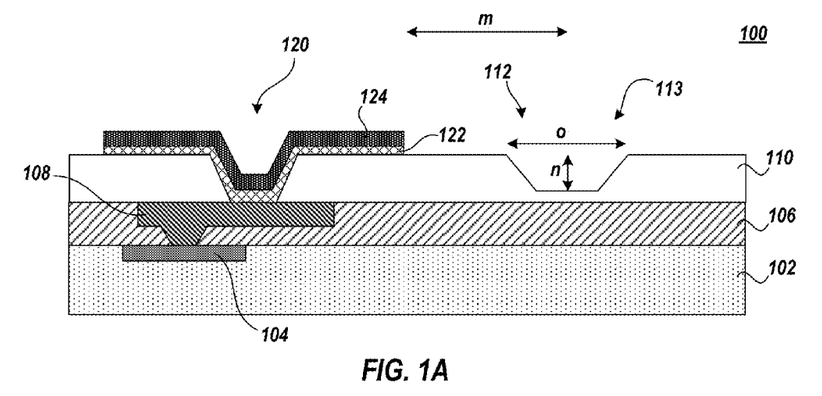
FIG. 1A and FIG. 1B depict cross section views of an exemplary IC chip including passivation layer topography, according to one or more embodiments of the present invention.
Figure 1B:
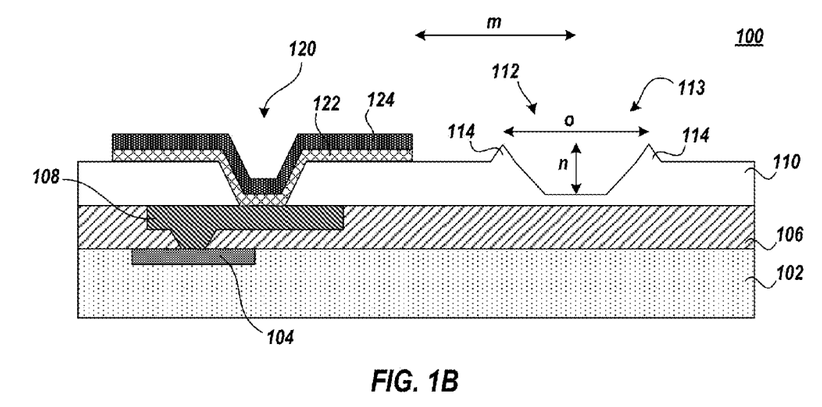

FIG. 1A and FIG. 1B depicts a cross section view of exemplary IC chips 100 including passivation layer topography structures 113. IC chip 100 includes semiconductor substrate layers 102, micro-device 104, hard dielectric layer(s) 106, wiring line 108, passivation layer 110, contact pad 120, and topography structure 113. In the present example, topography structure 113 takes the form as a passivation layer trench 112 extending below the top surface of the passivation layer 110 and above the top surface of hard dielectric layer(s) 106.

Substrate 102 is formed from a material such as silicon, silicon dioxide, aluminum oxide, sapphire, germanium, gallium arsenide (GaAs), an alloy of silicon and germanium, or indium phosphide (InP) that serves as the foundation upon which micro-electronic devices such as transistors, diodes, and integrated circuits (ICs) are formed. As is known in the art, Front End of Line fabrication is the first portion of IC chip 100 fabrication where micro-devices 104 (transistors, capacitors, resistors, etc.) are formed upon substrate 102.

As is also known in the art, back end of line is the second portion of IC chip 100 fabrication where the micro-device 104 is interconnected with wiring 108. During back end of line fabrication, a hard dielectric layer 106 is formed. Hard dielectric layer 106 is the uppermost inter-metal dielectric associated with the formation of the highest wiring 108 level.

Wiring 108 may be Copper (Cu), Cu alloy, Aluminum (Al), Al alloy, or the like. In a particular embodiment, wiring 108 is fabricated from Cu. Wiring 108 formation practices may include forming a damascene opening in an inter-metal dielectric layer(s) and depositing a barrier layer (not shown) such as TaN, lining the sidewalls and bottom of the opening in the prior to depositing the metal for the via or wire. The processes of forming an inter-metal dielectric layer followed by opening and wiring 108 formation may be repeated to form multiple wiring 108 layers as is known in the art. Typical diffusion barrier layer metals include tantalum (Ta), tantalum nitride (TaN), titanium nitride (TiN), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and any other combination of silicon nitrides for encapsulating Cu.

For clarity, though only one wiring 108 layer and associated hard dielectric layer 106 is shown in the exemplary IC chip 100, many additional wiring 108 layers and associated inter-metal dielectric layers may be included. For example, a particular IC chip 100 may include twelve wiring 108 and associated inter-metal dielectric layers, the upper most inter-metal dielectric layer being the hard dielectric layer 106. The hard dielectric layer 106 is formed from a dielectric material including, but not limited to, doped silicon carbide, silicon nitride, low-k materials, Tetraethyl orthosilicate (i.e., TEOS; Si(OC2H5)4), florinated TEOS (FTEOS), etc.

Subsequent to the formation of wiring 108 and hard dielectric layer 106, a passivation layer 110 is deposited upon the wiring 108 and associated hard dielectric layer 106. Passivation layer 110 includes at least one material that is capable of preventing moisture and/or ions from contacting wiring 108 associated with the hard dielectric layer 106. Suitable materials include, but are not limited to: SiO2, Si3N4, and combinations thereof, such as SiO2/Si3N4 or Si3N4/SiO2/Si3N4. The passivation layer 110 is patterned so as to form contact openings through the passivation layer 110 to expose underlying wiring 108. The contact openings are formed using standard lithographic techniques well known to those skilled in the art including: providing a photoresist to the passivation layer 110; patterning the photoresist; etching the patterned photoresist utilizing either a dry etch process such as RIE or a wet chemical etch process; and then stripping the photoresist. The exemplary thickness range of the passivation layer 110 is between 50 and 500 nm with an exemplary thickness of 200 nm.

Contact pad 120 is formed at least within the contact opening. Contact pad 120 may include a barrier layer 122 and contact layer 124. Barrier layer 122 may be formed over the exposed wiring 108, on the sidewalls of contact openings, and on the surface of passivation layer 110 near the contact openings. Any barrier layer known to those skilled in the art which ensures throughput of electrical current can be utilized. Examples of suitable barrier layers that can be employed include, but are not limited to: Ti, TaN, TiN, Ta, Cr, W, and combinations thereof. In a particular embodiment, barrier layer 122 is formed from TiW.

The barrier layer 122 may be formed utilizing deposition techniques well known to those skilled in the art. Thus, the barrier layer 122 can be formed by sputtering, chemical vapor deposition, plasma vapor deposition, electroplating, electroless plating and other like deposition techniques. The thickness of the barrier layer formed in the present invention may vary, but the thickness of the barrier layer is typically of 25 to 50 nm.

Contact layer 124 may be formed upon the surface of barrier layer 122. Contact layer 125 any contact layer known to those skilled in the art which ensures throughput of electrical current can be utilized. Examples of suitable contact layers that can be employed include, but are not limited to: Cu, Cr, and combinations thereof. In a particular embodiment, contact layer 124 is formed from Cu. The contact layer 124 may be formed utilizing any of the above described deposition techniques useful in forming barrier layer 122.

The contact 120 may then be patterned and etched utilizing standard techniques known in the art to remove undesired contact 120 material from passivation layer 110. For example, the contact layer 124 and the barrier layer 122 can be patterned by conventional lithography and then etched by reactive ion etching.

The exemplary passivation layer topography structure 113, as shown in FIG. 1A, includes a trench 112 within passivation layer 110. Topography structure 113 may also be referred to as an anchor. Trench 112 extends below the top surface of the passivation layer 100 and above the top surface of the hard dielectric layer 106. In other words, trench 112 lays entirely within the passivation layer 110. Trench 112 may be formed using standard lithographic techniques well known to those skilled in the art including: providing a photoresist to the passivation layer 110; patterning the photoresist; etching the patterned photoresist utilizing either a dry etch process such as RIE or a wet chemical etch process; and then stripping the photoresist. Trench 112 can be formed by a directional dry etch which can form substantially straight sidewalls or by a wet (or other isotropic) etch process which can form angled sidewalls, undercuts, etc. Such angled sidewalls may be beneficial to increase the surface area of passivation layer 110. In a particular embodiment, the angle is 45 degrees. In embodiments, the angle of trench 112 sidewalls may be different in a first region of IC chip 100 than the angle of trench 112 in a second region of IC chip 100.

The exemplary passivation layer topography structure 113, as shown in FIG. 1B, includes a trench 112 and ridges 114. Ridges 114 are passivation layer 110 material raised above the top surface of the passivation layer 110 about the perimeter of the trench 112. Trench 112 and ridges 114 may be simultaneously formed by drilling, boring, lasering, or other such mechanical material removal and displacement techniques. Ridges 114 may be the displacement of passivation layer 110 material while forming trench 112. To ensure sufficient electrical contact between contact pad 120 and the external circuit, the height of ridges 114 may be less than the height of contact 120. Ridges 114 may be beneficial to further increase the surface area of passivation layer 110.

In embodiments where passivation layer topography structures 113 are formed by lasering, topography structure 113 feature dimensions may change or otherwise differ from one location of IC chip 100 to another location of IC chip 100. For example, the depth "n" and/or the width "o" of trench 12, may be relatively smaller in a location near contact pad 120 and may be relatively larger in a location further from chip 120. In other words, the volume of one or more trenches 120 may increase proportionally, exponentially, etc. to a distance "m" away from contact pad 120.

Topography structure 113 generally results in a non-planar passivation layer 110 contact surface. The contact surface is the passivation layer 110 surface facing the external circuitry. At the same time, a bottom surface of the passivation layer 110 may have a planar surface because the topography structure 113 does not penetrate the bottom surface of the passivation layer 110. The bottom surface is the passivation layer 110 surface is facing the semiconductor substrate 102.

Figure 2:
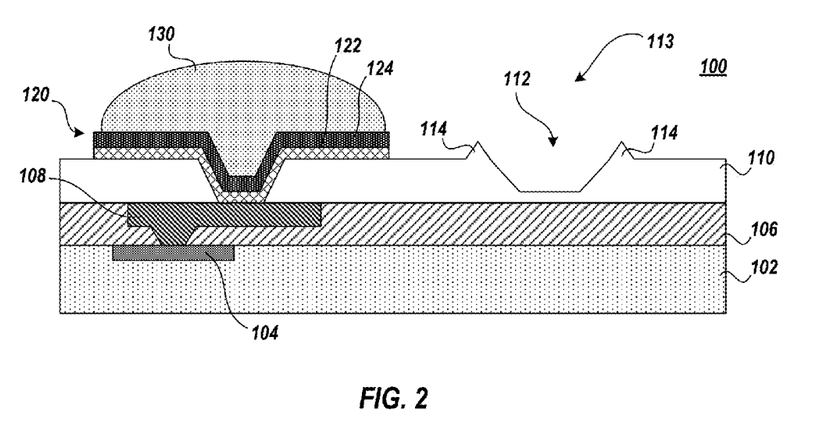
FIG. 2 depicts a cross section view of an exemplary IC chip including passivation layer topography, according to one or more embodiments of the present invention.

FIG. 2 depicts a cross section view of an exemplary IC chip 100 including passivation layer topography structure 113, according to one or more embodiments of the present invention. Bump 130 may be deposited upon IC chip 100. Bump 130 may be formed by techniques well known to those skilled in the art including: providing a mask upon the contact 120 and upon the passivation layer 110, depositing a photoresist upon the mask; patterning the photoresist; etching the patterned photoresist utilizing either a dry etch process such as RIE or a wet chemical etch process to form a trench within the mask above and at least partially exposing the contact 120; depositing bump 130 within the trench upon the exposed contact 120; and then stripping the photoresist and mask. Alternatively, bump 130 may be directly deposited on each contact pad 120.

Bump 130 serves several functions: electrically, bump 130 provides the conductive path from IC chip 100 to substrate the external circuitry, thermally, bump 130 also provides a thermally conductive path to carry heat from the IC chip 100 to the external circuitry, and mechanically, bump 130 provides part of the mechanical mounting of the IC chip 100 to the external circuitry, provides a spacer, preventing electrical contact between the IC chip 100 and external circuitry conductors, and acts as a short lead to relieve mechanical strain between IC chip 100 and external circuitry.

Bump 130 may be a solder bump. The contact layer 124 may serve as an under bump metallization (UBM) to define and limit the solder-wetted area. Solder is deposited over the UBM by evaporation, electroplating, screen printing solder paste, needle-depositing, etc. After solder bumping, the wafer may be sawn into bumped die. Bump 130 may be a plated bump. Wet chemical processes to plate conductive metal bumps onto the contact pads 120. Plated nickel-gold bumps may be formed on the contact pads 120 by electroless nickel plating. After plating the desired thickness of nickel, an immersion gold layer is added for protection, and the wafer is sawn into bumped die. Bump 130 may be a gold bump formed by forming a gold ball for wire bonding by melting the end of a gold wire to form a sphere. Bump 130 may be an adhesive bump formed by stenciling conductive adhesive to form bumps on contact pad 120. The cured adhesive acts as bumps.

Figure 3:
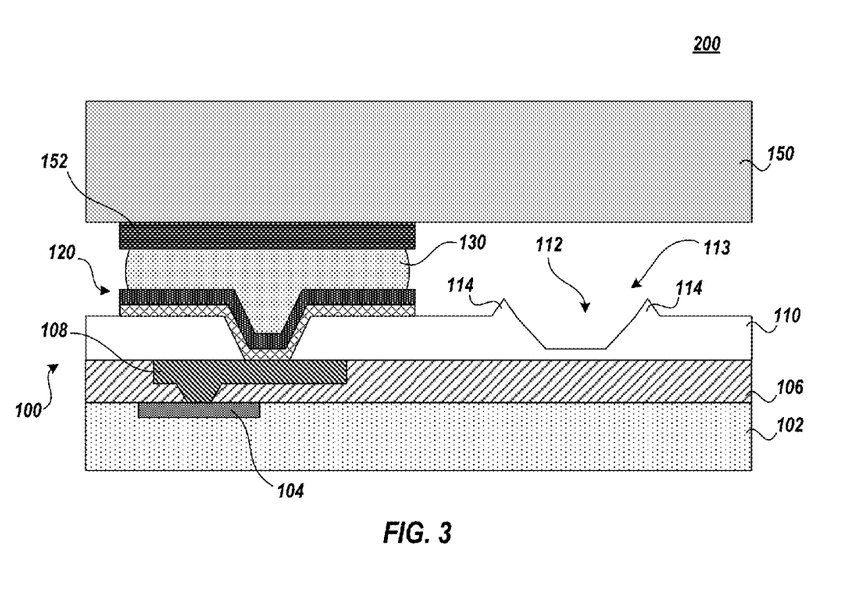
FIG. 3 depicts a cross section view of an exemplary flip chip IC chip package, according to one or more embodiments of the present invention.

FIG. 3 depicts a cross section view of an exemplary flip chip IC chip package 200 including IC chip 100 and external circuitry 150, according to one or more embodiments of the present invention. External circuitry 150 includes a contact pad 152 that is aligned with contact pad 120 and bump 130. External circuitry 150 may be a second IC chip 100, a MEMS device, a carrier, or the like. The bump 130 electrically connects the contact pad 120 with the contact pad 152. Depending upon the type of bump 130, the IC chip package 200 may be heated to e.g., reflow bump 130 to both contact pad 120 and contact pad 152.

Figure 4:
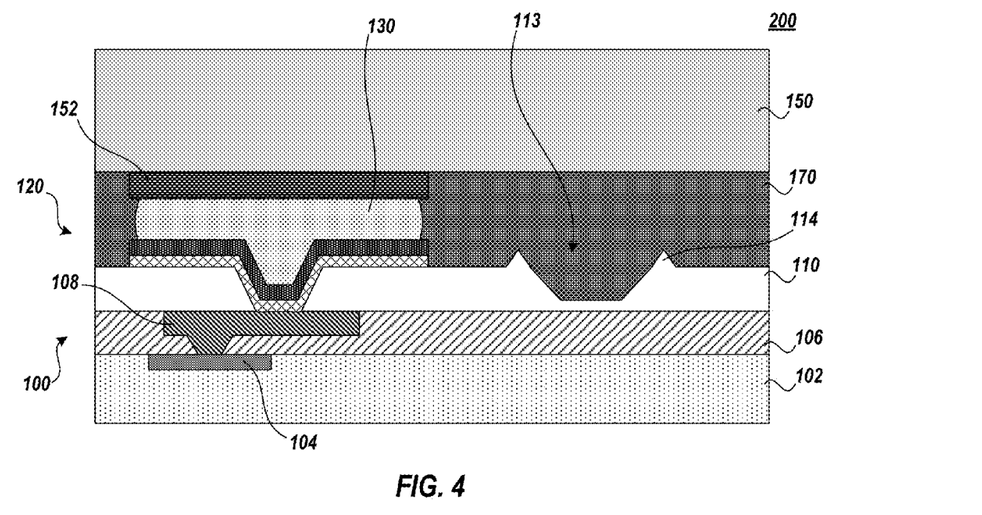
FIG. 4 depicts a cross section view of an exemplary flip chip IC chip package, according to one or more embodiments of the present invention.

FIG. 4 depicts a cross section view of flip chip IC chip package 200, according to one or more embodiments of the present invention. Underfill 170 is provided between the IC chip 100 and external circuitry 150. Underfill 170 protects bump 130 from moisture or other environmental hazards, and provides additional mechanical strength to external circuitry 150 and IC chip 200. Underfill 170 further compensates thermal expansion differences between the IC chip 100 and the external circuitry 150. Underfill 170 further mechanically joins the IC chip 100 and the external circuitry 150 so that differences in thermal expansion do not break or damage the electrical connection of the bump 130.

Underfill 170 may be a capillary underfill and may be needle-dispensed along the edges of the IC chip 100. It is drawn underneath the IC chip 100 by capillary action, and may be heat-cured to form a bond. Underfill 170 may be a no-flow underfill applied to IC chip 100 prior to the electrical connection of the external circuitry 150. Such underfill may also provide the flux activity for solder bumps 130 to form joints with the contact pads 152. Underfill 170 may be a solid underfill such as an anisotropic conductive adhesives (ACA), associated with bumps 130 gridded and associated therewith. The adhesive shrinks upon curing to create a connection tension spring between the IC chip 130 and external circuitry 150.

The topographical structures 113 increase the surface area between the IC chip 100 and the underfill 170, resulting in increased bonding between the IC chip 100 and the underfill 170. The topographical structures 113 may also aid in capillary underfill dispensing to adjust the capillary movement, velocity, or direction of underfill. Further, the topographical structures 113 may be placed in locations to avoid having a void form within the underfill itself. For example, trenches 112 may be placed to draw underfill into locations where underfill voids are likely to occur, e.g., the center of IC chip 100, etc.

Figure 5:
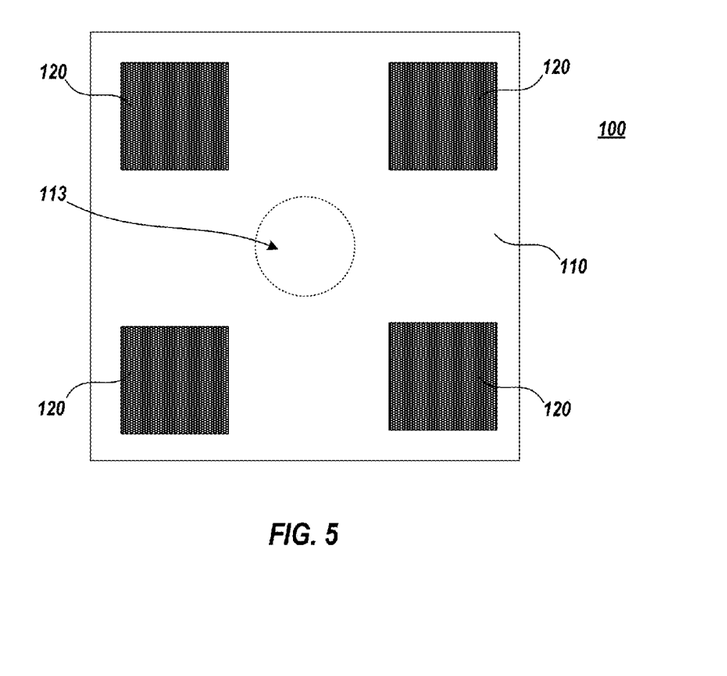
FIG. 5 depicts a top view of an exemplary IC chip including passivation layer topography between contact pads, according to one or more embodiments of the present invention.

FIG. 5 depicts a top view of IC chip 100 including passivation layer topography structure 113 positioned between contact pads 120, according to one or more embodiments of the present invention. Topography structure 113 may be centered upon and between two neighboring contact pads 120. As shown in FIG. 5, topography structure 113 may be centered between four neighboring contact pads 120. Topography structure 113 may generally be circularly shaped, elliptically shaped, square shaped, rectangular shaped, polygonal, angled cornered, rounded cornered, etc. For clarity, at least the trench 112 of topography structure 113 lays interior to the dashed line depicted.

Figure 6:
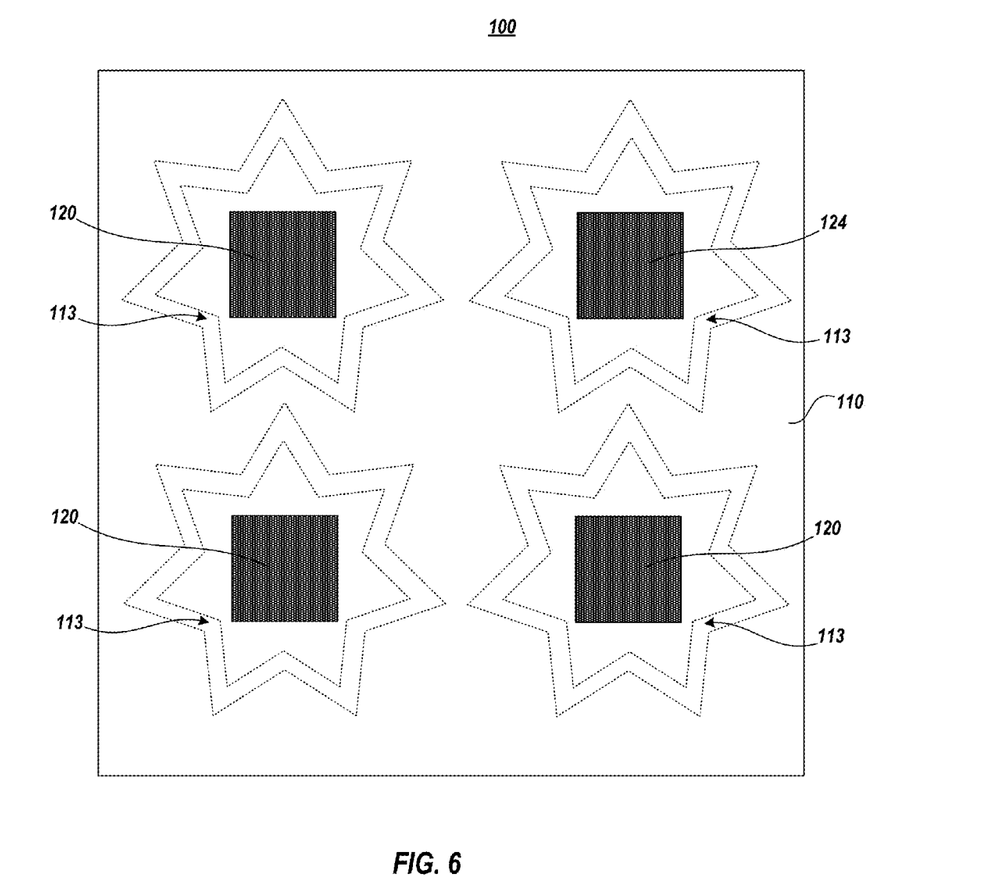
FIG. 6 depicts a top view of an exemplary IC chip including passivation layer topography surrounding contact pads, according to one or more embodiments of the present invention.

FIG. 6 depicts a top view of exemplary IC chip 100 including passivation layer topography structures 113 surrounding respective contact pads 120, according to one or more embodiments of the present invention. As shown in FIG. 6, topography structure 113 may be star polygonal shaped and centered about a particular contact pad 120. For clarity, at least the trench 112 of topography structures 113 lay interior to the dashed line depicted.

Figure 7:
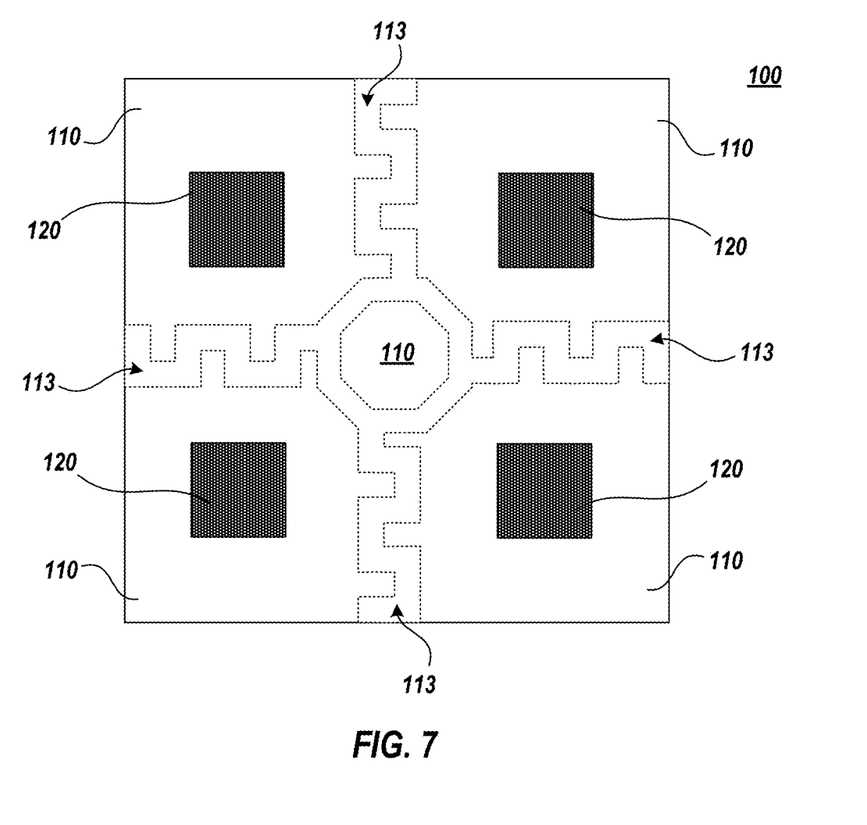
FIG. 7 depicts a top view of an exemplary IC chip including passivation layer topography between and surrounding contact pads, according to one or more embodiments of the present invention.

FIG. 7 depicts a top view of an exemplary IC chip 100 including passivation layer topography structure 113 between and surrounding contact pads 120, according to one or more embodiments of the present invention. As shown in FIG. 7, topography structure 113 may be snake or zigzag shaped between neighboring contact pads 120 and may connect to a topography structure 113 centered about four neighboring contact pads 120. For clarity, at least the trench 112 of topography structure 113 lays interior to the dashed line depicted.

Figure 8:
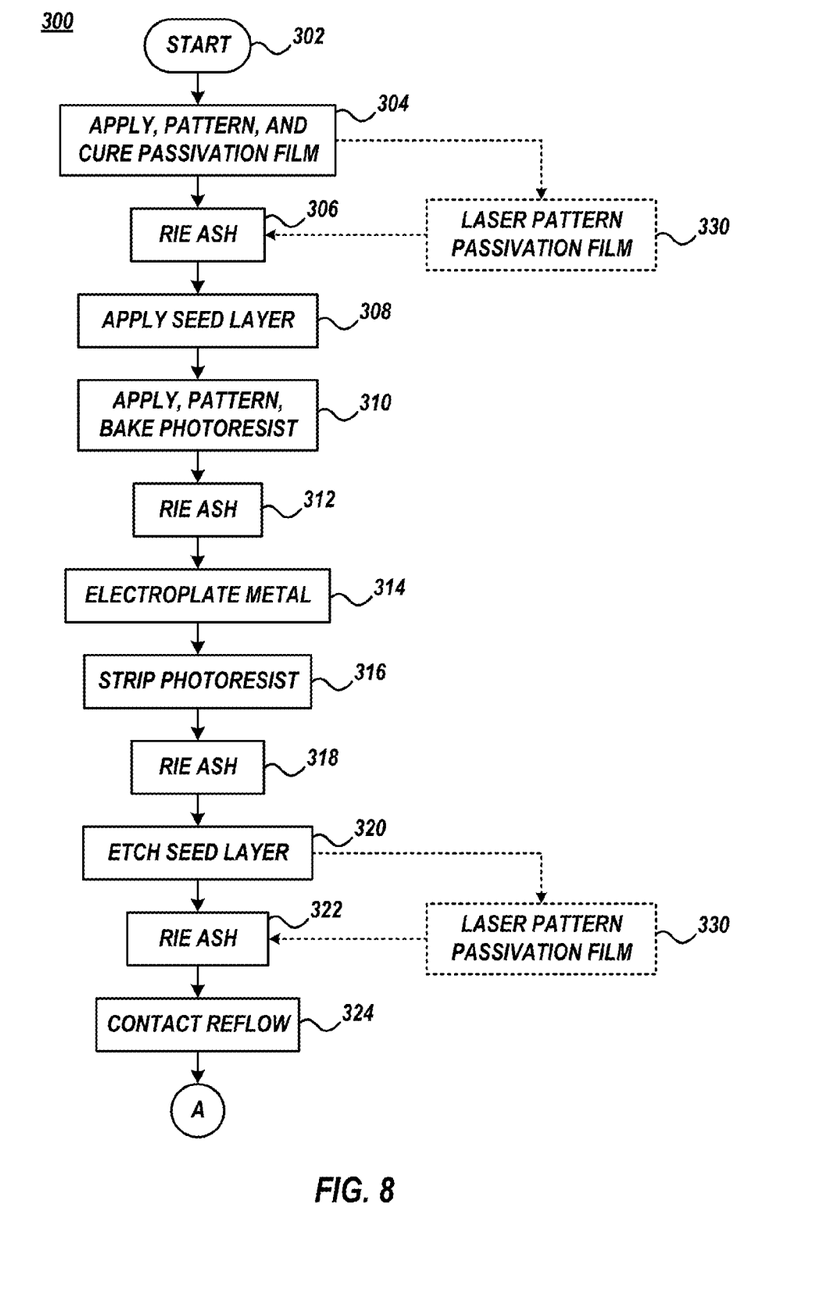
FIG. 8-FIG. 9 depicts an exemplary method of fabricating a flip chip IC chip package, according to one or more embodiments of the present invention.
Figure 9:
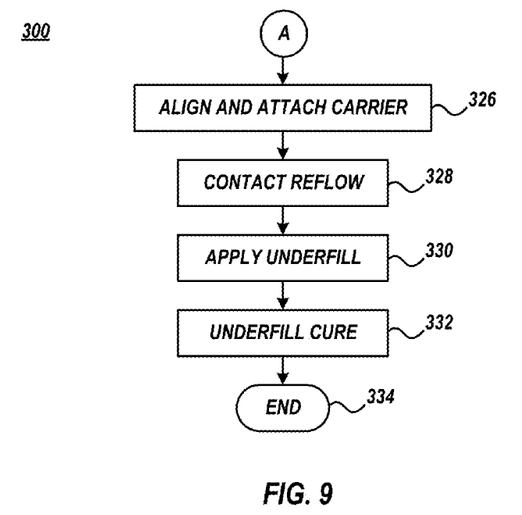

FIG. 8 and FIG. 9 depict an exemplary method 300 of fabricating an IC chip 100 and flip chip IC chip package 200, according to one or more embodiments of the present invention.

Method 300 begins at block 302 and continues with depositing, patterning, and curing a passivation layer 110 upon a semiconductor wafer having a top hard dielectric layer 106 (block 304). Layer 110 is deposited upon the wiring 108 and associated hard dielectric layer 106. The passivation layer 110 is patterned so as to form contact openings through the passivation layer 110 to expose underlying wiring 108. The contact openings are formed using standard lithographic techniques well known to those skilled in the art including: providing a photoresist to the passivation layer 110; patterning the photoresist; etching the patterned photoresist utilizing either a dry etch process such as RIE or a wet chemical etch process; and then stripping the photoresist.

Method 300 may continue with an oxygen, argon/oxygen, etc. reactive ion etch (RIE) ash to refresh the contact opening surfaces prior to contact formation therein (block 306). The RIE ash may remove any trace organics from the surfaces on which the contact pad 120 will be formed.

Method 300 may continue with forming a seed layer at least within the contact openings (block 308). The seed layer is deposited upon the passivation layer within the contact trenches and may be subsequently utilized in an electroplating processes to form contact pads 120. Method 300 may continue with depositing a mask upon the contact 120 and upon the passivation layer 110; and patterning the mask; (block 310).

Method 300 may continue with an oxygen, argon/oxygen, etc. RIE ash to refresh the contact opening surfaces prior to contact formation therein (block 312). The RIE ash is used to remove any trace organics from the top surface of the seed layer that are left over from the lithography process.

Method 300 may continue with forming bump contact pad 120 by electroplating a metal (e.g. solder, etc.) within the trench upon the exposed contact 120 (block 314) and stripping the photoresist and mask (block 316). Method 300 may continue with an oxygen, argon/oxygen, etc. RIE ash to refresh the contact pad 120 surfaces (block 318). The RIE ash is used to remove any trace organics left behind after stripping the photoresist which would interfere with the seed layer etching process.

Method 300 may continue with removing overburden seed layer material (block 320) and a RIE ash to refresh the passivation layer 110 surfaces (block 322). The RIE ash is used to remove any trace organics that might interfere with underfill adhesion. Method 300 may continue with depositing and reflowing the bump 130 to connect the bump 130 to contact pad 120 (block 324).

Topography structure 113 may be formed by laser patterning the passivation layer 110 subsequent to the depositing of the passivation layer 110 (block 304) and the RIE ash (block 306). Topography structure 113 may alternatively be formed by laser pattering the passivation layer 110 subsequent to the removal of the overburden seed layer material (block 320) and prior to the RIE ash (block 322).

Method 300 depicted upon FIG. 8 may be utilized to fabricate an IC chip 100 including topography structures 113.

On FIG. 9, method 300 may continue with aligning and attaching external circuit 150 to the IC chip 100. For example, contact pads 152 of the external circuit 150 are aligned with respective bumps 130. Method 300 may continue with reflowing the bumps 130 to electrically and mechanically connect IC chip 100 with external circuitry 150. For example, bump 130 provides the conductive path from IC chip 100 to the external circuitry 150, thermally, bump 130 also provides a thermally conductive path to carry heat from the IC chip 100 to the external circuitry 150, and mechanically, bump 130 provides part of the mechanical mounting of the IC chip 100 to the external circuitry 150, provides a spacer, preventing electrical contact between the IC chip 100 and external circuitry 150 conductors, and acts as a short lead to relieve mechanical strain between IC chip 100 and external circuitry 150.

Method 300 may continue with applying underfill 170 about the perimeter of IC chip 100 (block 330). For example, underfill 170 may be needle-dispensed along the edges of the IC chip 100 and drawn underneath the IC chip 100 by capillary action. Method 200 may continue with curing the underfill 170 to form a bond between the IC chip 100 and external circuitry 150. The topography structures 113 increase the surface area of passivation layer 110 and thus increase the bond between the IC chip 100 and the external circuitry 150. The method 300 depicted upon FIG. 8 and FIG. 9 may be utilized to fabricate an IC chip package 200. Method 300 ends at block 334.

Figure 10A:
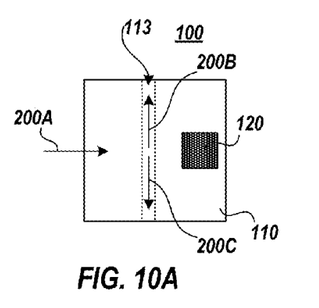
FIG. 10A-FIG. 10C depict top views of an exemplary IC chip including passivation layer topography to adjust a capillary underfill movement vector, according to one or more embodiments of the present invention.
Figure 10B:
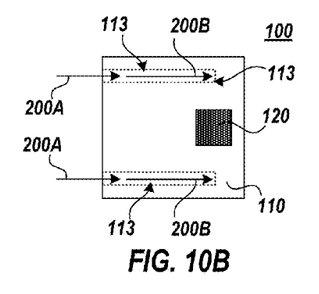
Figure 10C:
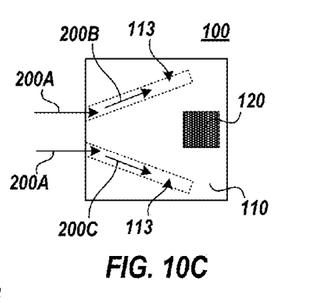

FIG. 10A-FIG. 10C depict top views of an exemplary IC chip 100 including a passivation layer topography structure 113 to adjust a capillary underfill movement vector, according to one or more embodiments of the present invention. In embodiments where underfill 170 is capillary underfill dispensed around the perimeter of IC chip 100 and drawn underneath the IC chip 100 by capillary action, topography structure(s) 113 may be positioned to influence the capillary underfill movement of the underfill 170. The underfill 170 generally moves at a first movement vector 200A including a first velocity and first direction. For example, underfill 170 dispensed around the perimeter of the IC chip moves from the perimeter of the IC chip toward the center of the IC chip at a nominal velocity.

As shown in FIG. 10A, a topography structure 113 may be positioned generally orthogonal to the first movement vector 200A. Once the underfill 170 reaches the topography structure 113, the topography structure 113 influences the prior first movement vector 200A of the underfill 170. In this instance, the topography structure 113 slows the overall velocity of the underfill 170 toward the contact pad 120 by diverting underfill 170 within the topography structure 113 generally in a second movement vector 200B and third movement vector 200C. The direction of the second movement vector 200B and third movement vector 200C may be orthogonal to the first movement vector 200A. Further, the velocity of the second movement vector 200B and third movement vector 200C may be greater than the velocity of the first movement vector 200A. The velocity of the moving underfill within the topography structure may be greater than average underfill movement velocity since the moving underfill 170 under IC chip 100 is briefly concentrated within the confined trench 112 of topography structure 113. The diversion of underfill 170 within the topography structure 113 positioned orthogonal to first movement vector 200A generally decreases the overall velocity of underfill 170 movement toward contact pad 120.

As shown in FIG. 10B, a topography structure 113 may be positioned generally parallel to the first movement vector 200A. Once the underfill 170 reaches the topography structure 113, the topography structure 113 influences the prior first movement vector 200A of the underfill 170. In this instance, the topography structure 113 speeds the overall velocity of the underfill 170 concentrating underfill 170 within the topography structure 113 generally in a second movement vector 200B. The direction of the second movement vector 200B is generally parallel to the first movement vector 200A. Further, the velocity of the second movement vector 200B is generally greater than the velocity of the first movement vector 200A. The concentration of underfill 170 within the topography structure 113 positioned parallel to first movement vector 200A generally increases the overall velocity of underfill 170 movement toward contact pad 120.

As shown in FIG. 10C, a topography structure 113 may be positioned angled relative to the first movement vector 200A. Once the underfill 170 reaches the topography structure 113, the topography structure 113 influences the prior first movement vector 200A of the underfill 170. In this instance, the topography structure 113 diverts the underfill 170 within the topography structure 113 generally in a second movement vector 200B and third movement vector 200C, respectively. The direction of the second movement vector 200B and the third movement vector 200C are generally angled to the first movement vector 200A. Further, the velocity of the second movement vector 200B and the third movement vector 200C may be greater than the velocity of the first movement vector 200A. The concentration of underfill 170 within the topography structure 113 angled relative to first movement vector 200A generally diverts the overall underfill 170 movement toward contact pad 120 to other locations of the IC chip 100. For example, the movement of underfill 170 may be diverted to the center of the IC chip 100 where underfill 170 voids may be likely to occur.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

Unless described otherwise, or in addition to that described herein, "forming," "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", and the like, are made by way of example, and not by way of limitation, to establish a frame of reference. The term "horizontal" as used herein is defined as a plane parallel to the conventional plane or surface of the substrate 102, regardless of the actual spatial orientation of the substrate 102. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A method to fabricate an electronic package comprising:
   depositing a passivation layer upon an upper inter-metallic dielectric layer of an integrated circuit (IC) chip;
   forming a topography structure within the passivation layer, wherein the topography structure comprises a trench of a depth less than the passivation layer thickness and a ridge raised above the passivation layer about the perimeter of the trench, and;

bonding the IC chip and the external circuitry with underfill between the external circuitry and the passivation layer.

2. The method of claim 1, wherein the topography structure increases surface area of the passivation layer.

3. The method of claim 1, wherein the topography structure lays between contact pads formed upon the passivation layer.

4. The method of claim 1, further comprising:
forming a contact trench within the passivation layer, the contact trench exposing a wiring line of the IC chip associated with the upper inter-metallic dielectric layer.

5. The method of claim 4, further comprising:
forming a contact pad within the contact trench.

6. The method of claim 5, further comprising:
forming a contact bump upon the contact pad.

7. The method of claim 6, further comprising:
aligning a contact pad of the external circuitry with the contact bump;
electrically connecting the IC chip with the external circuitry by reflowing the contact bump.

8. The method of claim 1, wherein the trench and the ridge are simultaneously formed.

9. An electronic package comprising:
an integrated circuit (IC) chip comprising a patterned passivation layer upon an upper inter-metallic dielectric layer, the patterned passivation layer comprising a topography structure within the passivation layer, the topography structure comprising a trench of a depth less than the passivation layer thickness and a ridge raised above the passivation layer about the perimeter of the trench, and;
external circuitry bonded to the IC chip with underfill between the external circuitry and the patterned passivation layer.

10. The electronic package of claim 9, wherein the topography structure increases surface area of the passivation layer.

11. The electronic package of claim 9, wherein the topography structure lays between contact pads upon the passivation layer.

12. The electronic package of claim 9, wherein the IC chip further comprises:
a contact upon the patterned passivation layer, the contact electrically connected to a wiring line of the IC chip associated with the upper inter-metallic dielectric layer.

13. The electronic package of claim 12, wherein the IC chip further comprises:
a contact bump upon the contact pad.

14. The electronic package of claim 13, wherein the external circuitry further comprises a contact pad and wherein the external circuitry contact pad contacts the contact bump.

15. A method comprising:
applying a passivation layer upon an uppermost inter-metallic dielectric layer of an integrated circuit (IC) chip;
laser forming a topography structure within the passivation layer, the topography structure comprising a trench of a depth less than the passivation layer thickness and a ridge raised above the passivation layer about the perimeter of the trench;
forming a contact trench within the passivation layer, the contact trench exposing a wiring line of the IC chip associated with the upper inter-metallic dielectric layer;
forming a contact pad within the contact trench, the contact pad electrically connected to the exposed wiring line;
depositing a solder bump upon the contact pad;
aligning external circuitry with the IC chip, the external circuitry compromising a contact pad aligned with the solder bump;
depositing underfill between the external circuitry and the passivation layer, the underfill bonding the IC chip and the external circuitry.

16. The method of claim 15, wherein the laser forming occurs prior to forming the contact trench within the passivation layer.

17. The method of claim 15, wherein the laser forming occurs subsequent to forming the contact trench within the passivation layer.

* * * * *